US006710733B2

(12) United States Patent
Gendai

(10) Patent No.: US 6,710,733 B2
(45) Date of Patent: Mar. 23, 2004

(54) COMPARATOR CIRCUIT

(75) Inventor: Yuji Gendai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/183,164

(22) Filed: Jun. 28, 2002

(65) Prior Publication Data

US 2003/0001767 A1 Jan. 2, 2003

(30) Foreign Application Priority Data

Jun. 29, 2001 (JP) ..................................... P2001-198279

(51) Int. Cl.[7] .............................. H03M 1/12; H03F 3/45
(52) U.S. Cl. .................... 341/155; 341/155; 341/143; 330/254
(58) Field of Search ................................ 341/143, 155, 341/110, 118, 120, 133; 327/1, 40, 50, 63, 65, 27; 330/254, 279

(56) References Cited

U.S. PATENT DOCUMENTS

| 4,276,543 | A | | 6/1981 | Miller et al. | |
|---|---|---|---|---|---|
| 5,045,807 | A | * | 9/1991 | Ishihara et al. | 330/260 |
| 5,057,716 | A | * | 10/1991 | Kung | 327/358 |
| 5,146,476 | A | * | 9/1992 | Whitehead et al. | 375/345 |
| 5,500,645 | A | * | 3/1996 | Ribner et al. | 341/143 |
| 5,621,408 | A | * | 4/1997 | Cake et al. | 341/143 |
| 5,907,261 | A | * | 5/1999 | Jones | 330/254 |
| 6,292,121 | B1 | * | 9/2001 | Cake et al. | 341/143 |
| 6,369,743 | B2 | * | 4/2002 | Ono | 341/159 |

OTHER PUBLICATIONS

"A 400 MSPS 8b Flash AD Conversation LSI", pp. 98–99 of ISSCC Digest of technocal Papers, Feb. 25, 1987.

* cited by examiner

Primary Examiner—Don Le
Assistant Examiner—Linh Van Nguyen
(74) Attorney, Agent, or Firm—Rader, Fishman & Grauer PLLC; Ronald P. Kananen

(57) ABSTRACT

Differential signals output by a transfer unit of a latch stage are fed back to a comparator stage as negative feedback signals through a feedback circuit including a differential amplifier comprising two transistors. In this configuration, amplitudes of signals supplied to the transfer unit are stabilized by a feedback effect provided by the feedback circuit to become independent of a through-rate of an input signal supplied to the comparator stage. To be more specific, if the through-rate is high, the amplitudes are reduced, but if the through-rate is low, the amplitudes are increased. As a result, variations in sampling delay related to sampling clock signals are suppressed. With this configuration, for example, harmonic distortions in a flash A/D converter are suppressed as well.

3 Claims, 8 Drawing Sheets

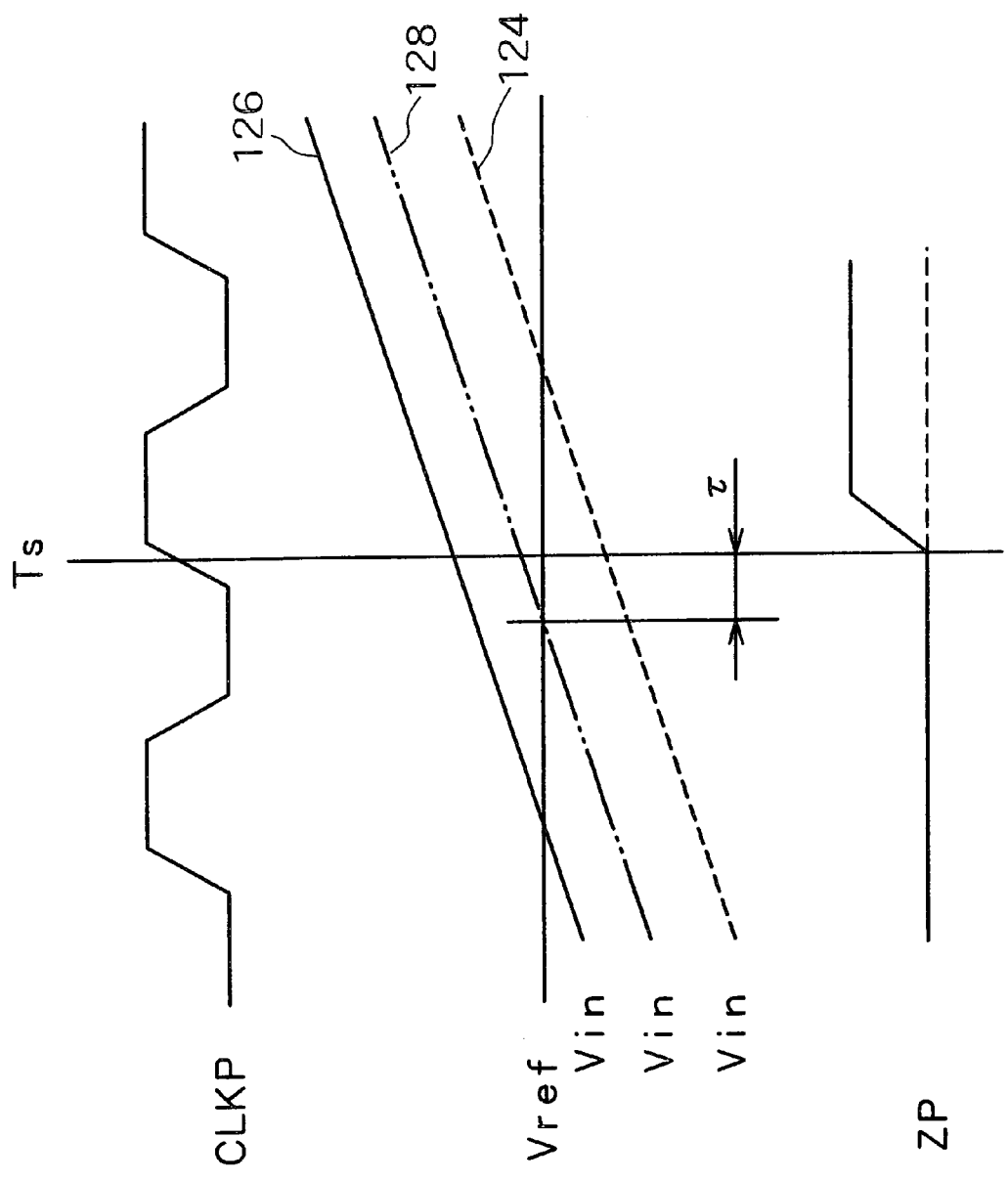

COMPARATOR CIRCUIT

BACKGROUND OF THE INVENTION

The present invention relates to a comparator circuit employed in a flash A/D converter.

In converting an analog signal into a digital signal at a high speed, the conventional flash A/D converter is used. The basic configuration of the flash A/D converter is commonly known and described in U.S. Pat. No. 4,276,543. In the flash A/D converter, it is necessary to compare an analog signal with a number of reference voltages by using the same number of comparator circuits. Thus, the performance of the flash A/D converter is affected by the performance of the comparator circuits.

FIG. 3 is diagram showing a comparator circuit employed in the A/D converter disclosed in the U.S. patent mentioned above.

An analog input terminal 104 is a terminal common to all the comparator circuits 102. An analog input signal Vin to be converted into a digital signal is supplied to the analog input terminal 104. A reference voltage Vref is supplied to each of the comparator circuits 102. The reference voltage Vref that varies from comparator circuit 102 to comparator circuit 102 is supplied to a reference voltage 106. A latch (or a master latch) circuit 108 at the first stage of the comparator circuit 102 is directly connected to the analog input terminal 104 for receiving the analog input signal Vin and a reference-voltage terminal 106 for receiving the reference voltage Vref. Thus, switching noises attributed to sampling clock signals CLK and CLK' are returned to the input side in a phenomenon known as a 'kickback', causing conversion noises to increase.

In order to avoid this phenomenon, there has been proposed a comparator circuit 118 having a configuration in which, as shown in FIG. 4, a pre-amplifier is provided as a comparator stage 112 in front of a master latch 110, the comparator stage 112 and the latch stage 110 are separated from each other, a power-supply line AVCC in the comparator stage 112 is separated from a power-supply line DVCC in the latch stage 110, a ground line AGND in the comparator stage 112 is separated from a ground line DGND in the latch stage 110, and the comparator stage 112 and the latch stage 110 are connected to each other only by an emitter-follower comprising transistors 114 and 116. For more information on the comparator circuit 118, refer to a document authored by Yukio Akazawa, Atushi Iwata, Tsutomu Wakimoto, Tshuomu Kamato, Hiroaki Nakamura and Hyoh Ikawa entitled "A 400 MSPS 8b Flash AD Conversion LSI" of ISSCC Digest of Technical Papers, pp. 98–99, issued in February 1987. At the present time, such a configuration is adopted as a standard of comparator circuits employed in flash A/D converters.

In addition, since the comparator stage 112 and the latch stage 110 are separated from each other in this configuration, the range of the reference voltages Vref in the comparator circuits 112 can be widened. Furthermore, at the latch stage 110, the number of transistors provided in series between the power-supply line DVCC and the ground line DGND, that is, the number of vertically connected transistors, is small. A small number of such transistors is advantageous for efforts to reduce the level of the power supply.

The main characteristics of the flash A/D converter include an input-distortion-vs-frequency characteristic. FIG. 5 is a diagram showing a graph representing a typical result of a measurement of the input-distortion-vs-frequency characteristic in the conventional flash A/D converter. In the figure, the horizontal axis represents the frequency and the vertical axis represents an SNDR, which is an abbreviation of Signal to (Noise+Distortion) Ratio.

The graph shown in FIG. 5 is obtained by supplying a voltage sinusoidal over almost its full range to a 6-bit A/D converter and applying FFT processing to the output of the A/D converter. The output of the A/D converter includes not only analog distortions but also quantization distortions. A signal including distortions of both types is evaluated by using the SNDR.

As shown in FIG. 5, as the frequency increases, the SNDR decreases. A main cause of the decrease in SNDR is the increase in low-order harmonic components with frequencies of two to three times the frequency of the input signal. This cause is identified from results of a frequency analysis carried out on the signal output by the A/D converter.

With regard to a mechanism in which such a low-order harmonic distortion (which is referred to simply as a harmonic distortion) is generated, there are many causes of the distortion. In addition, the causes are related to each other so that it is difficult to analyze the causes. As a result, the causes are not well identified so far.

A typical analysis of harmonic distortions is disclosed in "Integrated Analog-to-Digital and Digital-to-Analog Converters" by Rudy van de Plassche, a publication of Kluwer Academic Publishers, in 1994, on page 189 to 203. FIG. 6 is a diagram showing a model of the comparator circuit in relationship to the analysis of harmonic distortions and is also shown on page 191 of this reference. In accordance with this model, the comparator circuit comprises an amplitude limiter 120 and a primary delay system 122. This model can be used for explaining relatively well the phenomenon in a qualitative manner. Since the latch stage is not taken into consideration, however, the model is too simple to represent the actual comparator circuit.

SUMMARY OF THE INVENTION

It is thus an object of the present invention addressing the problems described above to provide a comparator circuit introducing only a few variations in sampling delay and capable of suppressing harmonic distortions in a flash A/D converter or the like.

In order to achieve the object described above, the present invention provides a comparator circuit that includes a comparator stage including a first differential amplifier circuit; a latch stage for fetching signals output by the comparator stage and holding as well as outputting level signals for the fetched signals synchronously with sampling clock signals; and a feedback circuit for feeding back signals output by the latch stage to the comparator stage as negative feedback signals; wherein the latch stage includes a second differential amplifier circuit for inputting the signals output by the comparator stage; and a latch main unit for holding signals output by the second differential amplifier circuit; and the second differential amplifier circuit and the latch main unit work alternately in synchronization with the sampling clock signals.

In the case of an input signal with a high through-rate, the comparator stage supplies differential signals each having a sufficient amplitude to the second differential amplifier circuit serving as a transfer unit of the latch stage as described above. Thus, even while the second differential amplifier circuit is transiting to a non-operative state to result in a low sensitivity, the second differential amplifier circuit is capable of driving and inverting the latch main unit. As a result, the sampling delay becomes shorter.

For a comparator circuit implemented by this embodiment, however, the signals output by the second differential amplifier circuit each have sufficient amplitude at that time. Thus, the signals output by the comparator stage are strongly suppressed by a negative feedback effect provided by the feedback circuit and, as a result, signals input to the second differential amplifier circuit become weaker. In consequence, the second differential amplifier circuit is no longer capable of inverting the latch main unit unless the timing is a timing providing a sensitivity higher than the conventional comparator circuit. As a result, the sampling delay becomes longer.

In the case of an input signal with a low through-rate, on the other hand, the comparator stage supplies differential signals each having an insufficient amplitude to the second differential amplifier circuit of the latch stage as described above. Thus, if the second differential amplifier circuit is transiting to a non-operative state to result in a low sensitivity, the second differential amplifier circuit is not capable of driving the latch main unit. As a result, the sampling delay is longer.

In the case of the comparator circuit implemented by this embodiment, however, the signals output by the second differential amplifier circuit each have a small amplitude at that time. Thus, the signals output by the comparator stage are not so suppressed by the negative feedback effect provided by the feedback circuit and, as a result, signals input to the second differential amplifier circuit become stronger. In consequence, the second differential amplifier circuit is capable of inverting the latch main unit even if the timing is a timing providing a sensitivity lower than the conventional comparator circuit. As a result, the sampling delay becomes shorter.

As a result, in the case of the comparator circuit implemented by this embodiment, as a whole, variations in sampling delay are suppressed.

In addition, in a flash A/D converter employing a comparator circuit provided by the present invention, variations in sampling delay in the comparator circuit are small, resulting in suppressed harmonic distortions.

BRIEF DESCRIPTION OF THE DRAWINGS

FIGS. 8A and 8B are diagrams showing respectively waveforms of a sampling clock signal CLKP and an analog input Vin supplied to the comparator circuit shown in FIG. 4, and FIG. 8C is a diagram showing a signal ZP output by a latch stage of the comparator circuit.

DETAILED DESCRIPTION OF THE PREFERRED EMBODIMENTS

From analyses and experiences conducted by the inventor of the present invention, the inventor concluded that, in a well designed flash A/D converter, a dominant cause of the harmonic distortions is a delay time of the comparator circuit. Stated simply, a sampling delay changes in accordance with the input signal.

Figure 7:
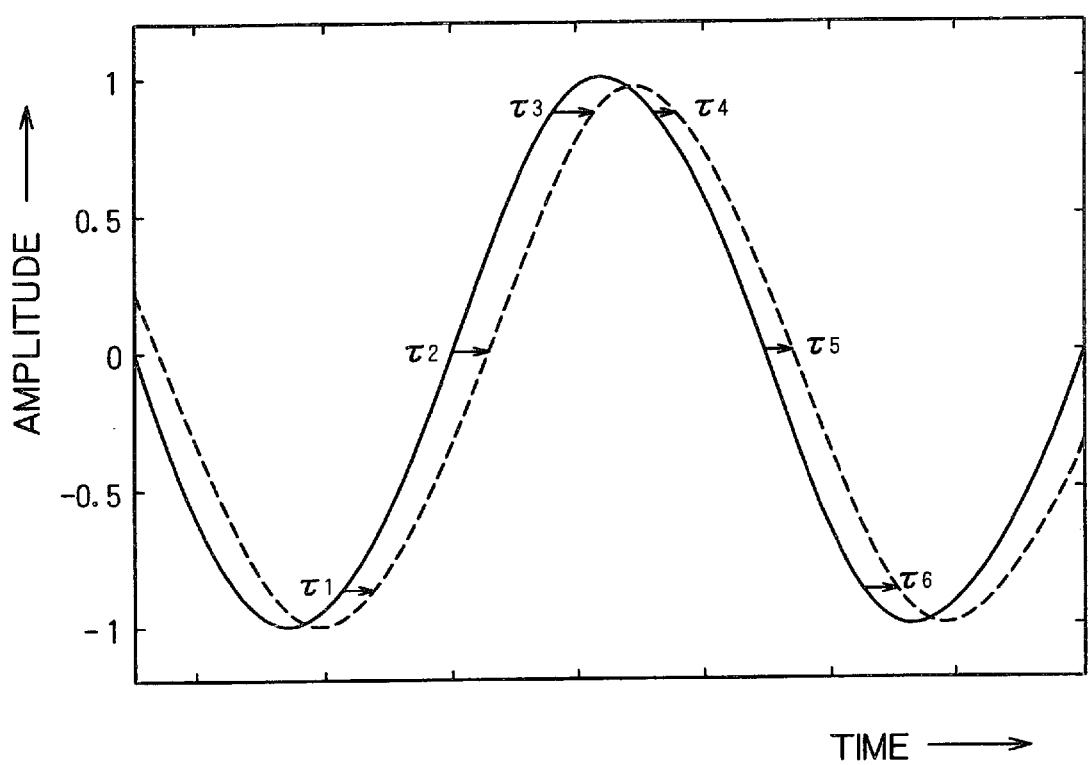
FIG. 7 is a diagram showing waveforms of an A/D converter's input and output signals superposed on each other in a virtual manner.

FIG. 7 is a diagram showing waveform input and output signals of an A/D converter superposed on each other in a virtual manner. In FIG. 7, the horizontal axis represents the lapse of time and the vertical axis represents the relative value of the amplitude. The solid-line curve is the waveform of the input signal whereas the dashed-line curve represents the output codes obtained as a result of conversion. For the sake of convenience, the output codes are transformed into an analog quantity. The output of an actual A/D converter has discrete amplitudes at discrete times. With regard to harmonic distortions, however, the fact that the output of the A/D converter has discrete amplitudes at discrete times is a trivial matter, so that the output can be treated like an analog quantity.

It should be noted that, in the actual A/D converter, an output code is output at a pipeline delay following a sampling operation of the input signal. That is, the pipeline delay is a delay time corresponding to several clock periods of a sampling clock signal. In order to make a sampling delay easy to understand, however, FIG. 7 shows output codes as a dashed-line curve by assuming that there is no pipeline delay.

As shown in FIG. 7, the waveform of the output codes lags behind the input signal only by a sampling-delay time. The sampling delay has typical values τ1 to τ6, which are different from timing to timing in 1 period of the sinusoidal waveform. Thus, the output-code waveform is obtained not by merely delaying the input signal. Instead, the output-code waveform has a shape different from the waveform of the input signal and includes harmonic distortions.

The variations in sampling delay, which cause harmonic distortions, are generated as follows.

FIGS. 8A and 8B are diagrams showing respectively waveforms of a sampling clock signal CLKP and an analog input Vin, which are supplied to the comparator circuit 118, whereas FIG. 8C is a diagram showing a signal ZP output by the latch stage.

First of all, consider a case in which the input signal Vin crosses the reference voltage Vref from the lower side to the upper side of the reference voltage Vref with a timing lagging behind a sampling time Ts by a sufficiently long time delay as shown by a waveform 124 in FIG. 8B. The sampling time Ts is a timing with which the sampling clock signal CLKP changes from a low level to a high level. In this case, the signal ZP output by the comparator circuit 118 does not change but stays at a low level as it is even after the sampling time Ts, and is shown by a dotted line in FIG. 8C.

Next, considers a case in which the input signal Vin crosses the reference voltage Vref from the lower side to the upper side of the reference voltage Vref with a timing leading ahead of the sampling time Ts by a sufficiently long lead time as shown by a waveform 126 in FIG. 8B. In this case, a signal output by the comparator stage 112 is latched into the latch stage 110 and the signal ZP output by the comparator circuit 118 changes from a low level to a high level at the sampling time Ts, as is shown by a solid line in FIG. 8C.

Thus, between these two lagging and leading timings, there is a boundary on which the output signal ZP can be either inverted or stayed at a low level. With this boundary timing, the input signal Vin crosses the reference voltage Vref from the lower side to the upper side of the reference voltage Vref as shown by a waveform 128 in FIG. 8B. A time from this boundary timing to the sampling time Ts is referred to as a sampling delay τ.

The sampling delay τ is very dependent on the through-rate of the input signal Vin. Strictly speaking, the sampling delay τ can be considered to be expressible as a complex function depending on the waveform of the input signal Vin and the reference voltage Vref.

It should be noted that, in FIGS. 8A through 8C, the rising timing of the sampling clock signal CLKP or, accurately speaking, the time at which the sampling clock signal CLKP crosses the sampling clock signal CLKN having a phase different from the phase of the sampling clock signal CLKP by 180 degrees is taken as the sampling time Ts. In actuality, however, the time at which sampling occurs is shifted slightly from the time at which the sampling clock signal CLKP crosses the sampling clock signal CLKN. Nevertheless, this shift can be ignored without causing any problems in a study of variations in sampling delay.

Figure 4:
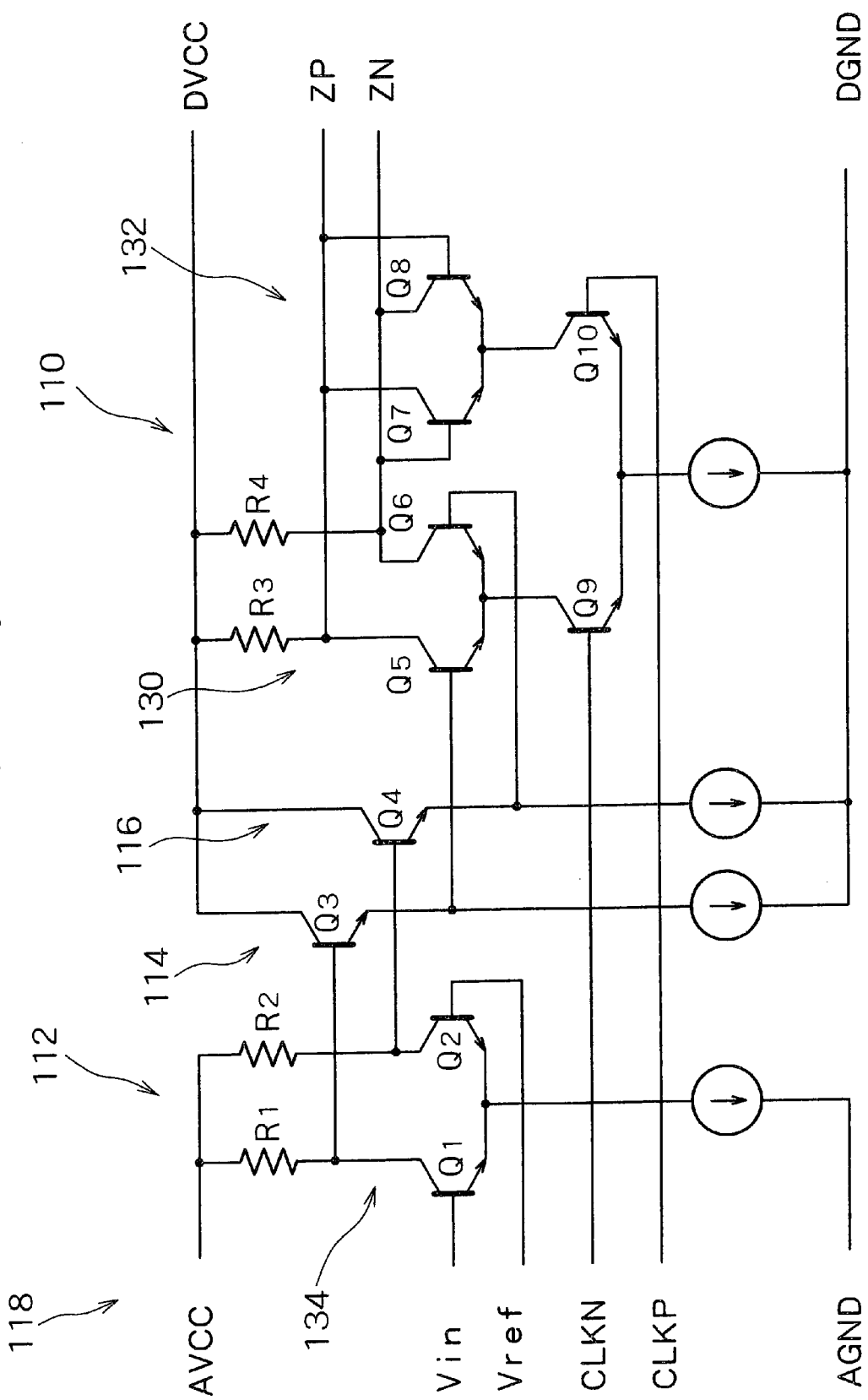
FIG. 4 is a circuit diagram showing another conventional comparator circuit.
Figure 5:
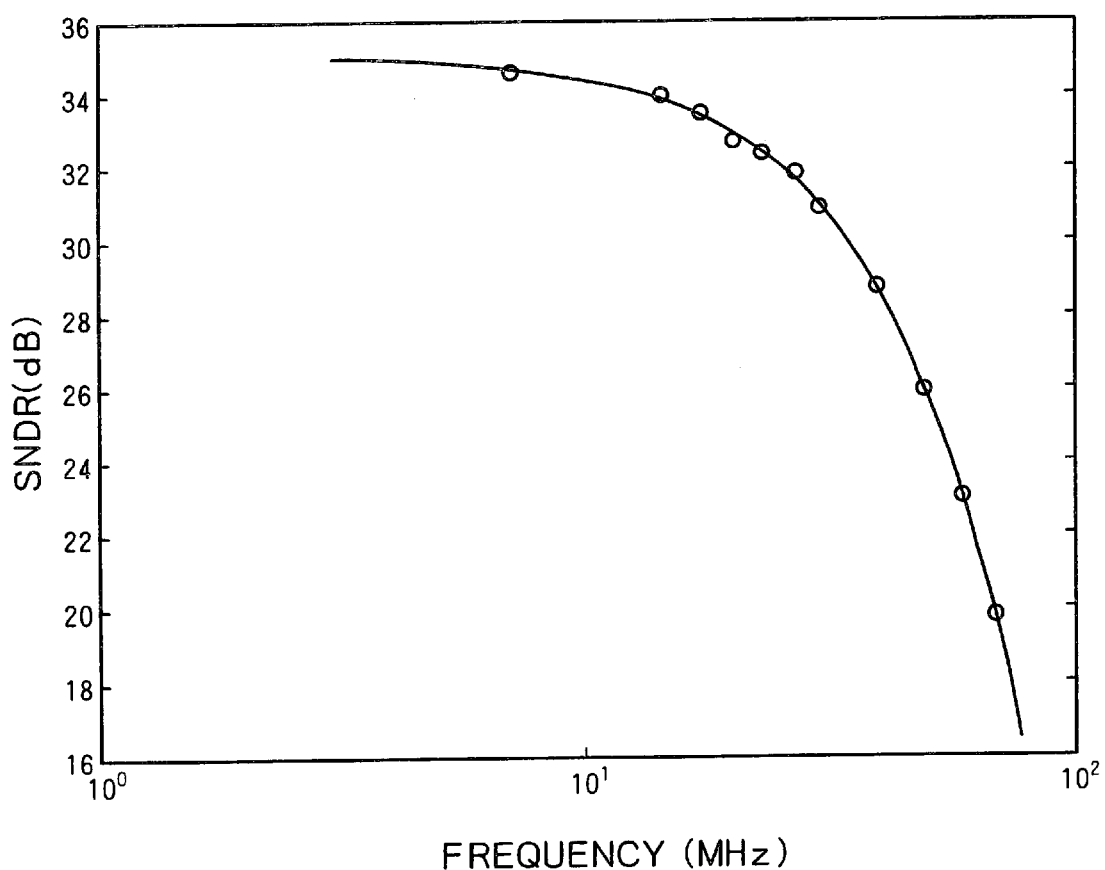
FIG. 5 is a graph showing a typical result of a measurement of an input-distortion-vs-frequency characteristic in the conventional flash A/D converter.
Figure 6:
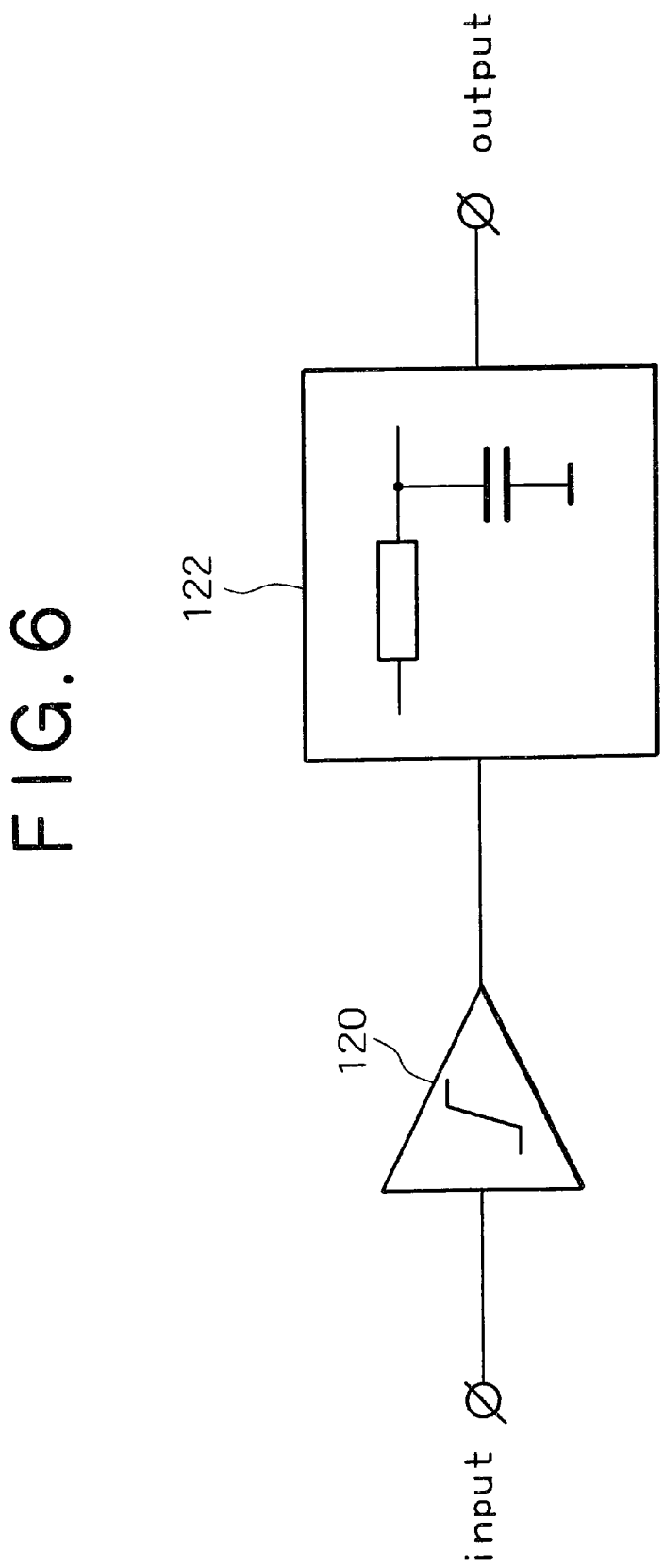
FIG. 6 is a diagram showing a model of a comparator-circuit configuration relevant to analyses of harmonic distortions.

By referring to FIG. 4, the following description concretely explains a mechanism in which the sampling delay τ changes in dependence on the input signal Vin. As an example, the description takes a case in which the sampling clock signal CLKP changes from a low level to a high level. The second differential amplifier circuit, that is, the transfer unit 130 which comprises the transistors Q5 and Q6 to serve as the master latch 110, has a gradually decreasing amplification since the transistor Q9 changes from an on state to an off state, causing the current to no longer flow. Thus, the sensitivity as a comparator gradually decreases. On the other hand, the latch main unit 132, which comprises the transistors Q7 and Q8 to serve as the master latch 110 enters an operative state since the transistor Q10 changes from an off state to an on state, causing a current to flow. At a stage the sampling clock signal CLKP turns to a high level, the latch main unit 132 enters a state of holding an input signal prevailing in the immediately preceding state. What is described above is a normal operation of the master latch 110.

In order to assure the transitions described above with a high degree of reliability, the latch circuit normally has a prescribed setup time and a prescribed hold time and prohibits an input signal from changing during these times. As is obvious from FIG. 8, however, it is quite within the bounds of probability that, in the flash A/D converter, the input signal changes with either timing. As a result, a variation in sampling delay τ occurs due to a cause explained as follows.

Assume that the through-rate of the input signal Vin is large and the input signal Vin changes from a level sufficiently lower than the reference voltage Vref to a level sufficiently higher than the reference voltage Vref. In this case, the first differential amplifier circuit 134, which comprises the transistors Q1 and Q2 to serve as the comparator stage 112, functions as a switch circuit with a fixed delay time. A signal output by this switch can completely change to a high or low level at a speed independent of the input signal. For this reason, in this case, the latch main body 132 is driven by the transfer unit 130 until a timing with which the sensitivity of the transfer unit 130 decreases to a certain degree. As a result, the sampling delay becomes a small value, which is all but fixed. Assume that such a state occurs in the middle of the amplitude of the input signal with a sinusoidal waveform as shown in FIG. 7. In this case, in a comparator circuit 118 with a reference voltage Vref having the same level as the middle of the amplitude, the sampling delay does not change much and has a small value. Sampling delays τ2 and τ5 and sampling delays in close proximity to τ2 and τ5 in FIG. 7 are each a sampling delay referred to in this case. It should be noted that, for a reason to be described later, the sampling delay τ2 is generally slightly longer than the sampling delay τ5.

In the case of an input signal with a small through-rate, on the other hand, the differential amplifier circuit 134 functions as a linear amplifier instead of functioning as a switch circuit. Thus, recharging and discharging currents of parasitic capacitors relevant to the differential amplifier circuit 134 decrease and the propagation delay time of the comparator stage 112 thus increases. In addition, in the case of an input signal Vin with a magnitude close to the reference voltage Vref, the comparator stage 112 is thus capable of outputting only a voltage proportional to a difference between the input signal Vin and the reference voltage even from a direct-current point of view. As a result, these two causes are combined to result in a small amplitude of the input signal supplied to the master latch 110 so that the latch main unit 132 can thus be inverted only for a transition with a long period of time in which the sensitivity of the transfer unit 130 is large.

Assume that the input signal has a sinusoidal waveform like one shown in FIG. 7. In this case, as the input signal approaches the peak of the waveform, the sampling delay increases abruptly in a comparator circuit 118 with its reference voltage Vref set at a level close to the peak. Sampling delays τ3 and τ6 are each a sampling delay referred to in this case.

In addition, at levels close to the peak of the sinusoidal waveform, there are cases in which the comparator stage 112 cannot be inverted. As a result, the output-code amplitude decreases.

In the comparator circuit 118 with a reference voltage Vref set at a level before or after the peak of the sinusoidal waveform, right after the input voltage exceeds the reference voltage Vref at a level before the peak, the input signal becomes lower than the reference voltage Vref. Thus, before a signal output by the comparator stage 112 completely becomes a high or low level in an inversion after the input signal Vin exceeds the reference voltage Vref, the input signal Vin becomes lower than the reference voltage Vref and returns to the original level. Thus, immediately following the peak of the sinusoidal waveform, after the input signal Vin becomes lower than the reference voltage Vref, the delay time becomes very short until the signal output by the comparator stage 112 becomes a supposed level. Thus, in an area around the peak of the sinusoidal waveform, the sampling delay becomes shorter like sampling delays τ1 and τ4.

In addition, the sampling delay for a rising input signal Vin is different from the sampling delay for a decreasing input signal Vin. As is obvious from comparison of the sampling delay τ5 with the sampling delay τ2, in general, the sampling delay for a rising input signal Vin is long while the sampling delay for a decreasing input signal Vin is short (It should be noted that this difference is particularly emphasized in FIG. 7.) This is mainly because the input signal Vin dynamically changes while the reference voltage Vref is a fixed voltage, so that the transistors Q1 and Q2 as well as their parasitic capacitors enter different operating states.

As described above, the sampling delay phenomenon is a very non-linear phenomenon. It is thus difficult to make an analytical model. In addition, simulation based on numerical calculation also is difficult. For these reasons, no effective means for dealing with harmonics was identified so far. To the utmost, there is adopted a technique by which a circuit current flowing through each component in every comparator circuit is increased to raise the speed of the comparator circuit. In addition, with this technique, by increasing the currents to a certain degree, an effect can be obtained. If the currents are further increased, however, a limit at which harmonic distortions can no longer be improved is reached.

In addition, there is a conceivable method by which a sample-hold circuit is provided before the comparator circuit to keep the levels of the input signal before and after a sampling operation at fixed values. Since a sample-hold circuit having a high speed by itself requires an advanced technology, however, it is quite within the bounds of possibility that the problem is merely transferred from the comparator circuit to the sample-hold circuit. In addition, the sample-hold circuit generally requires a higher power-supply voltage than the A/D converter. Thus, there is raised a problem of more power consumption.

A preferred embodiment of the present invention is explained by referring to the diagrams as follows.

Figure 1:
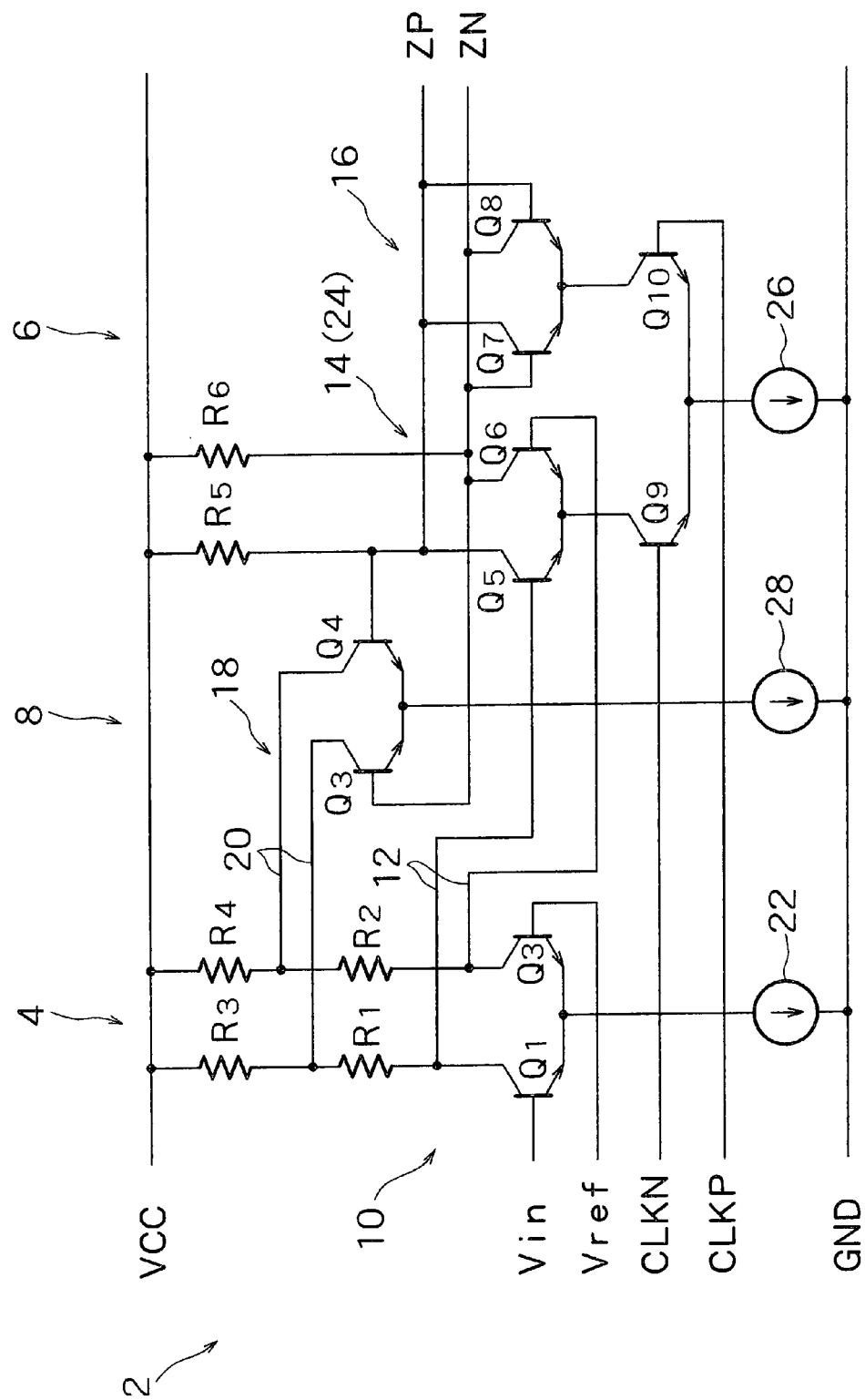
FIG. 1 is a circuit diagram showing a comparator circuit provided by the present invention.

FIG. 1 is a diagram showing a comparator circuit 2 provided by the present invention.

A flash A/D converter includes a number of comparator circuits 2 each implemented by an embodiment of the present invention and the same number of different reference voltages to be compared with an analog signal input to the converter. As shown in FIG. 1, the comparator circuit 2 comprises a comparator stage 4, a latch stage 6 and a feedback circuit 8. The comparator stage 4 compares the magnitudes of two signals with each other and outputs two signals each having 2 levels different from each other in dependence on the result of the comparator. The two signals input to the comparator stage 4 are the input signal Vin and the reference voltage Vref. The latch stage 6 fetches the signals output by the comparator stage 4 and holds as well as outputs level signals for the fetched signals synchronously with sampling clock signals CLKP and CLKN. The feedback circuit 8 feeds the signals output by the latch stage 6 back to the comparator stage 4 as negative feedback signals.

To put it in detail, the comparator stage 4 includes a first differential amplifier circuit 10 functioning as a comparator. The latch stage 6 receives differential signals 12 output by the first differential amplifier circuit 10 of the comparator stage 4 as input signals and outputs differential signals ZP and ZN having levels representing the input signals. The feedback circuit 8 feeds the differential signals ZP and ZN output by the latch stage 6 back to the first differential amplifier circuit 10 as negative feedback signals.

The latch stage 6 comprises a second differential amplifier circuit 14 and a latch main unit 16. The second differential amplifier circuit 14 is used for inputting the differential signals 12 output by the first differential amplifier circuit 10, and the latch main unit 16 is used for holding signals output by the second differential amplifier circuit 14. The second differential amplifier circuit 14 and the latch main unit 16 work alternately in synchronization with the sampling clock signals CLKP and CLKN.

As shown in FIG. 1, the feedback circuit 8 has a third differential amplifier circuit 18. The differential signals ZP and ZN output by the second differential amplifier circuit 14 of the latch stage 6 are supplied to the third differential amplifier circuit 18, which outputs differential signals 20 to the first differential amplifier circuit 10 of the comparator stage 4.

The first differential amplifier circuit 10 includes transistors Q1 and Q2, which form a differential pair. The transistors Q1 and Q2 are respectively first and second transistors provided by the present invention. The collector of the transistor Q1 is connected to a power-supply line VCC by a circuit comprising resistors R1 and R3 connected to each other in series. The resistors R1 and R3 are respectively first and second resistors provided by the present invention. By the same token, the collector of the transistor Q2 is connected to the power-supply line VCC by a circuit comprising resistors R2 and R4 connected to each other in series (The resistors R2 and R4 are respectively the third and fourth resistors provided by the present invention.) One of the differential signals 20 output by the third differential amplifier circuit 18 is supplied to a junction point between the resistors R1 and R3 while the other differential signal 20 is supplied to a junction point between the resistors R2 and R4. The emitters of the transistors Q1 and Q2 are both connected to one terminal of a constant-current generator 22. The other end of the constant-current generator 22 is connected to the ground GND. The input signal Vin and the reference voltage Vref are supplied to the bases of the transistors Q1 and Q2, respectively.

The latch stage 6 comprises the second differential amplifier circuit 14, which serves as a transfer unit 24 and the latch main unit 16. The second differential amplifier circuit 14 includes transistors Q5 and Q6, which form a differential pair. The collectors of the transistors Q5 and Q6 are connected to the power-supply line VCC by resistors R5 and R6 respectively. The emitters of the transistors Q5 and Q6 are both connected to the collector of a transistor Q9, which functions as a switching means. The bases of the transistors Q5 and Q6 are connected to the collectors of the transistors Q1 and Q2 respectively. The collectors of the transistors Q1 and Q2 each serve as an output terminal of the first differential amplifier circuit 10. The emitter of the transistor Q9 is connected to one specific terminal of a constant-current generator 26. The other end of the constant-current generator 26 is connected to the ground GND.

The latch main unit 16 includes transistors Q7 and Q8, which form a differential pair. The bases of the transistors Q7 and Q8 are connected to the collectors of the transistors Q6 and Q5 respectively. The emitters of the transistors Q7 and Q8 are both connected to the collector of a transistor Q10, which functions as a switching means. The collectors of the transistors Q7 and Q8 are connected to the bases of the transistors Q8 and Q7 respectively. The collectors of the transistors Q7 and Q8 output the differential signals ZP and ZN respectively. The emitter of the transistor Q10 is connected to the specific terminal of the constant-current generator 26.

Two clock signals CLKN and CLKP with phases different from each other by 180 degrees are supplied to the transistors Q9 and Q10 to turn on and off the transistors Q9 and Q10 alternately. Thus, the transfer unit 24 and the latch main unit 16 also work alternately.

As shown in FIG. 1, the third differential amplifier circuit 18 functioning as the feedback circuit 8 has transistors Q3 and Q4, which form a differential pair. The collector of the transistor Q3 (serving as an output terminal of the third differential amplifier 18) is connected to a junction point between the resistors R1 and R3. By the same token, the collector of the transistor Q4 (serving as another output terminal of the third differential amplifier 18) is connected to a junction point between the resistors R2 and R4. The emitters of the transistors Q3 and Q4 are both connected to one terminal of a constant-current generator 28. The other terminal of the constant-current generator 28 is connected to the ground GND. The bases of the transistors Q3 and Q4 are connected respectively to the collectors of the transistors Q6 and Q5 of the transfer unit 24.

In addition, unlike the comparator circuit shown in FIG. 4, in this embodiment, the power-supply line VCC and the ground line GND are each a line common to the comparator stage 4 and the latch stage 6.

In such a configuration, the comparator circuit 2 serving as a comparator means has the following basic operations. The comparator stage 4 compares the input signal Vin with the reference voltage Vref and outputs results of the comparison, as differential signals 12 appearing at the collectors of the transistors Q1 and Q2. The differential signals 12 are supplied to the bases of the transistors Q5 and Q6, which form the transfer unit 24 of the latch stage 6. During a period of time in which the sampling clock signal CLKN is set at a high level while the sampling clock signal CLKP is set at a low level, the transistor Q9 is put in a conductive state. Thus, during this period of time, the transfer unit 24 outputs signals through the collectors of the transistors Q5 and Q6.

Later on, the phase of the sampling clock signal CLKN is changed to the phase of the sampling clock signal CLKP and vice versa, turning the transistor Q10 on and the transistor Q9 off. As a result, the latch main unit 16 takes and holds differential signals output by the transfer unit 24 right before the transfer unit 24 enters the non-conductive state. The differential signals held by the latch main unit 16 are output as the differential signals ZP and ZN. These operations are repeated each time the phase of the sampling clock signal CLKN is changed to the phase of the sampling clock signal CLKP and vice versa.

In addition to the basic operations described above, the feedback circuit 8 employed in the comparator circuit 2 implemented by this embodiment feeds back the outputs of the latch stage 6 to the comparator stage 4 as negative feedback signals. As a result, variations in sampling delay are suppressed as follows.

In the case of an input signal with a high through-rate, the comparator stage 4 supplies differential signals 12 each having a sufficient amplitude to the transfer unit 24 of the latch stage 6 as described above. Thus, even while the transfer unit 24 is transiting to a non-operative state to result in a low sensitivity, the transfer unit 24 is capable of driving and inverting the latch main unit 16. As a result, the sampling delay becomes shorter.

In the case of the comparator circuit 2 implemented by this embodiment, however, the signals output by the transfer unit 24 each have a sufficient amplitude at that time. Thus, the signals output by the comparator stage 4 are strongly suppressed by a negative feedback effect provided by the feedback circuit and, as a result, signals input to the transfer unit 24 become weaker. In consequence, the transfer unit 24 is no longer capable of inverting the latch main unit 16 unless the timing is a timing providing a sensitivity higher than the conventional comparator circuit. As a result, the sampling delay becomes longer.

It should be noted that, while the transfer unit 24 is transiting to a non-operative state, the latch main unit 16 inversely transits to an operative state. At that instance, both the transfer unit 24 and the latch main unit 16 are operating simultaneously. During such a period of time, the negative feedback from the latch main unit 16 also works effectively to lengthen the sampling delay.

In the case of an input signal with a low through-rate, on the other hand, the comparator stage 4 supplies differential signals each having a small amplitude to the transfer unit 24 of the latch stage 6 as described above. Thus, if the transfer unit 24 is transiting to a non-operative state to result in a low sensitivity, the transfer unit 24 is not capable of driving the latch main unit 16. As a result, the sampling delay is longer.

In the case of the comparator circuit 2 implemented by this embodiment, however, the signals output by the transfer unit 24 each have an insufficient amplitude at that time. Thus, the signals output by the comparator stage 4 are not so suppressed by the negative feedback effect provided by the feedback circuit and, as a result, signals input to the transfer unit 24 become stronger. In consequence, the transfer unit 24 is capable of inverting the latch main unit 16 even if the timing is a timing providing a sensitivity lower than the conventional comparator circuit. As a result, the sampling delay becomes shorter.

It should be noted that, as described above, while the transfer unit 24 and the latch main unit 16 are each transiting to an opposite state, both the transfer unit 24 and the latch main unit 16 are operating simultaneously, albeit on a temporary basis. During such a period of time, nevertheless, the negative feedback from the latch main unit 16 also works effectively to suppress variations in sampling delay.

As a result, in the case of the comparator circuit 2 implemented by this embodiment, as a whole, variations in sampling delay are suppressed.

In addition, variations in sampling delay are generated due a cause other than a difference in through-rate as described above. Also in this case, the negative feedback effect provided by the embodiment stabilizes the amplitudes of the differential signals 12 supplied to the transfer unit 24. Thus, variations in sampling delay are suppressed effectively.

In addition, in a flash A/D converter incorporating the comparator circuit 2 implemented by the embodiment, since variations in sampling delay that occur in the comparator circuit 2 are small, harmonic distortions can be suppressed. Results of simulation based on numerical calculation carried out by the inventor of the present invention also verify that harmonic distortions can be suppressed in a flash A/D converter incorporating the comparator circuit 2 implemented by the embodiment.

Next, a second embodiment of the present invention is explained.

Figure 2:
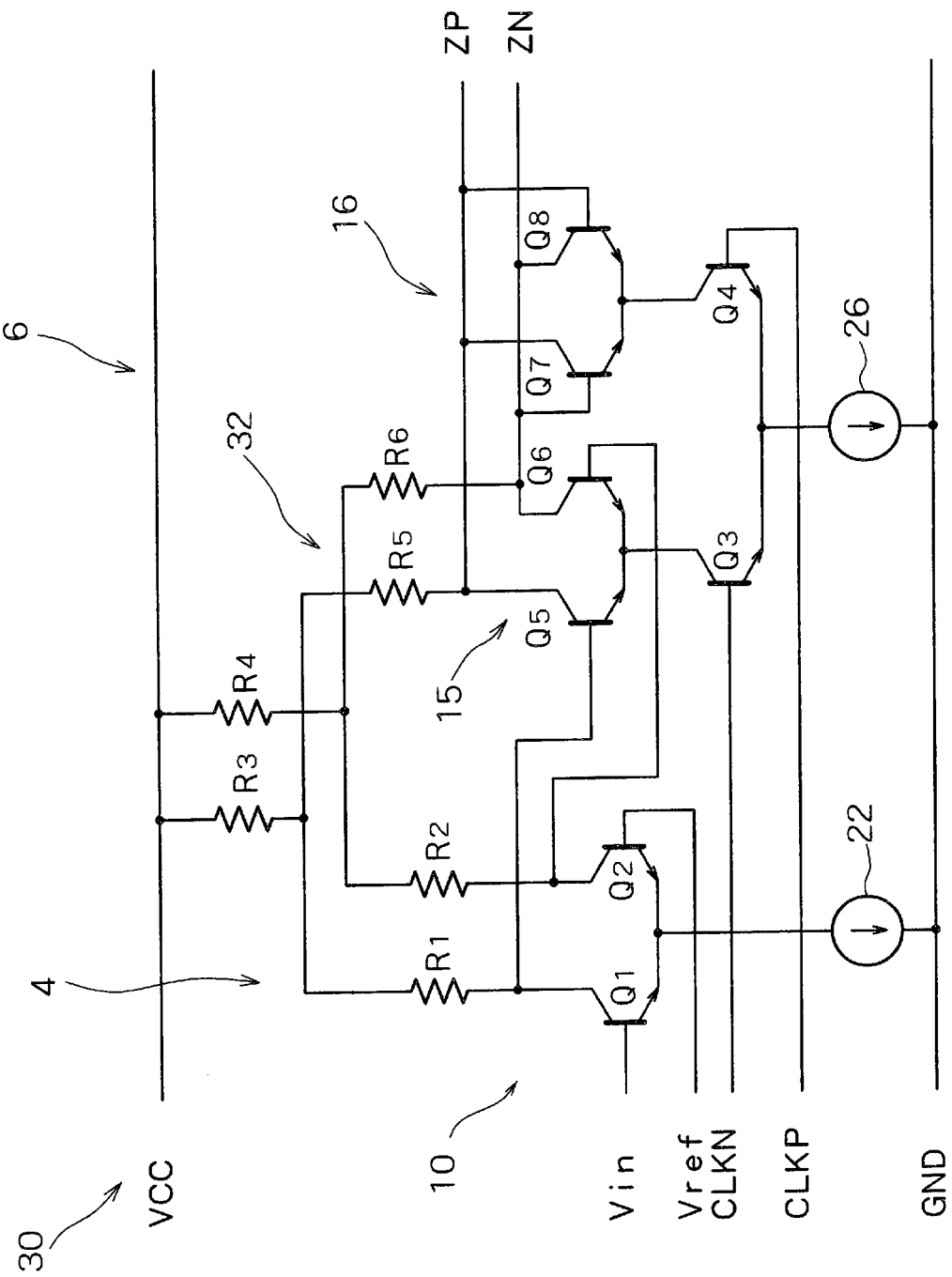
FIG. 2 is a circuit diagram showing a comparator circuit implemented by the second embodiment of the present invention.
Figure 3:
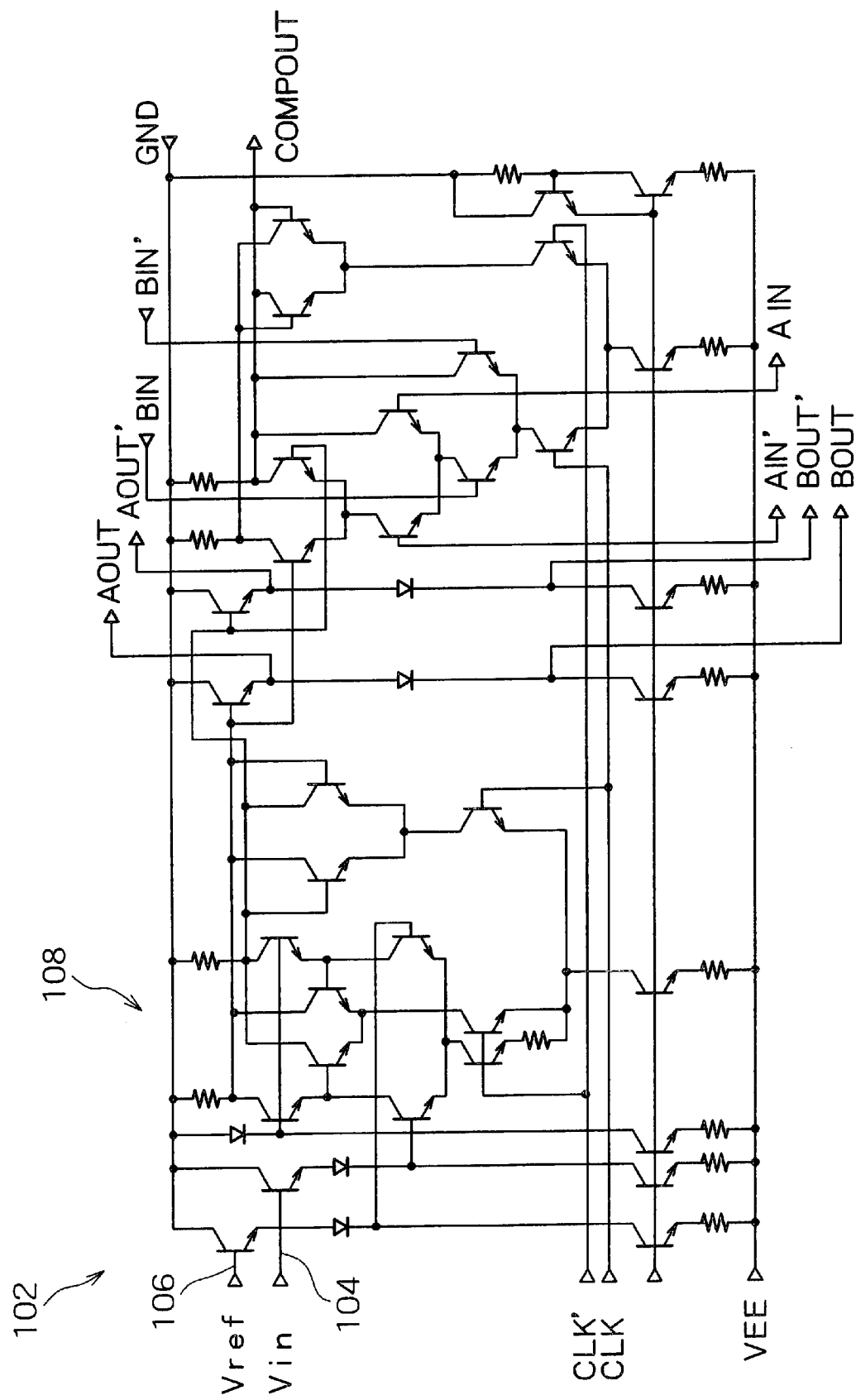
FIG. 3 is a circuit diagram showing a comparator circuit employed in the conventional A/D converter.

FIG. 2 is a diagram showing a comparator circuit implemented by the second embodiment of the present invention. Components of the second embodiment that are identical with their counterparts shown in FIG. 1 are denoted by the same reference numerals as the counterparts.

A comparator circuit 30 employed in the second embodiment shown in FIG. 2 is different from the comparator circuit 2 described above in that the feedback circuit 8 is replaced by a configuration in which the comparator stage and the latch stage have a common impedance. That is to say, in the second embodiment, resistors R5 and R6, which serve as a load of a differential amplifier circuit 15, form a feedback circuit 32. The resistor R5 connects the collector of the transistor Q5 to the junction point between the resistors R1 and R3 while the resistor R6 connects the collector of the transistor Q6 to the junction point between the resistors R2 and R4. A load circuit of the differential amplifier circuit 15 has a configuration including the resistors R5 and R6, which form the feedback circuit 32, and a load circuit of a differential amplifier circuit 10. The load circuit of the differential amplifier circuit 10 includes resistors R3 and R4.

In such a configuration, however, a feed-through from the comparator stage 4 to the latch stage 6 occurs. As a whole, nevertheless, a signal can be sufficiently fed back from the latch stage 6 to the comparator stage 4 as a negative feedback signal. Thus, the same effect as the comparator circuit 2 can be obtained.

By means of a simulation based on numerical calculation, the inventor of the present invention has verified that it is possible to suppress harmonic distortions in a flash A/D converter employing the comparator circuit 30 implemented by the second embodiment. The inventor also proved the suppression of harmonic distortions in an actual comparator circuit implemented as an integrated circuit.

In addition, in this second embodiment, a negative feedback loop can be provided without increasing the number of components and the power consumption. In the case of a flash A/D converter, in particular, a number of comparator circuits are required. Thus, the effects demonstrated by the comparator circuits are great.

It should be noted that the present invention can be applied to not only to a case in which a large number of comparator circuits are employed in a flash A/D converter, but of course also to a case of using a comparator circuit as a standalone unit. Also in the latter case, variations in sampling delay are suppressed to exhibit the effects described above.

The embodiments described above and the conventional comparator circuit shown in FIG. 4 have something in common, i.e., the comparator and latch stages. In the case of the conventional comparator circuit, however, one needs to pay attention to the fact that the comparator stage and the latch stage are separated from each other. In the case of the embodiments, on the other hand, there is provided a configuration in which the comparator stage is affected on the contrary by the latch stage through a feedback circuit. Thus, the comparator circuits implemented by the embodiments each have a design basically different from the conventional comparator circuit shown in FIG. 4. In addition, unlike the conventional comparator circuit shown in FIG. 4, in the case of the embodiments, the comparator stage and the latch stage share a common power-supply line and a common ground line. Development of simulation technology in recent years makes it possible to verify that the kickback effect is so small that it can be ignored even if a common power-supply line and a common ground line are shared by the comparator and latch stages.

While the preferred embodiments of the present invention have been described using the specific terms, such description is for illustrative purposes only, and it is to be understood that changes and variations may be made without departing from the spirit or scope of the following claims.

What is claimed is:

1. A comparator circuit comprising:
    a comparator stage including a first differential amplifier circuit;
    a latch stage for fetching signals output by said comparator stage and holding as well as outputting level signals for said fetched signals synchronously with sampling clock signals; and
    a feedback circuit for feeding back signals output by said latch stage to said comparator stage as negative feedback signals,
    wherein said latch stage comprises:
        a second differential amplifier circuit for inputting said signals output by said comparator stage; and
        a latch main unit for holding signals output by said second differential amplifier circuit, wherein said second differential amplifier circuit and said latch main unit work alternately in synchronization with said sampling clock signals;
    wherein said feedback circuit feeds back differential signals output by said latch stage to said comparator stage is negative feedback signals,
    wherein said feedback circuit includes a third differential amplifier circuit for feeding back said differential signals output by said latch stage to said first differential amplifier circuit employed in said comparator stage, and
    wherein said first differential amplifier circuit comprises:
        first and second transistors forming a differential pair;
        a collector of said first transistor is connected to a power-supply line by a circuit comprising first and second resistors connected to each other in series;
        a collector of said second transistor is connected to said power-supply line by a circuit comprising third and fourth resistors connected to each other in series;
        one of said differential signals output by said third differential amplifier circuit is supplied to a junction point between said first and second resistors, and the other one of said differential signals output by said third differential amplifier circuit is supplied to a junction point between said third and fourth resistors.

2. A comparator circuit according to claim 1 wherein:
    said first differential amplifier circuit comprises first and second transistors forming a differential pair;
    a collector of said first transistor is connected to a power-supply line by a circuit comprising first and second resistors connected to each other in series;
    a collector of said second transistor is connected to said power-supply line by a circuit comprising third and fourth resistors connected to each other in series;
    one of said differential signals output by said latch stage is supplied to a junction point between said first and second resistors by way of a resistor employed in said feedback circuit; and
    the other one of said differential signals output by said latch stage is supplied to a junction point between said third and fourth resistors by way of another resistor employed in said feedback circuit.

3. A comparator circuit according to claim 1, said comparator circuit embedded in a flash A/D converter.

* * * * *

UNITED STATES PATENT AND TRADEMARK OFFICE
CERTIFICATE OF CORRECTION

PATENT NO.    : 6,710,733 B2
DATED         : March 23, 2004
INVENTOR(S)   : Yuji Gendai It is certified that error appears in the above-identified patent and that said Letters Patent is hereby corrected as shown below:

Column 12,
Line 16, replace "stage is" with -- stage --.

Signed and Sealed this

Twentieth Day of July, 2004

JON W. DUDAS
*Acting Director of the United States Patent and Trademark Office*